United States Patent
Mycynek

(10) Patent No.: US 6,686,972 B1
(45) Date of Patent: Feb. 3, 2004

(54) VSB RESET TO MINIMIZE DATA LOSS

(75) Inventor: Victor G. Mycynek, Des Plaines, IL (US)

(73) Assignee: Zenith Electronics Corporation, Lincolnshire, IL (US)

( * ) Notice: Subject to any disclaimer, the term of this patent is extended or adjusted under 35 U.S.C. 154(b) by 0 days.

(21) Appl. No.: 09/516,219

(22) Filed: Mar. 1, 2000

(51) Int. Cl.[7] .............................................. H04N 5/445
(52) U.S. Cl. ...................................... 348/726; 348/731
(58) Field of Search ................................. 348/731, 732, 348/733, 726; 375/344, 345, 320, 321; H04N 5/445, 5/52

(56) References Cited

U.S. PATENT DOCUMENTS 6,239,848 B1 * 5/2001 Mycynek et al.
6,430,233 B1 * 8/2002 Dillon et al.
6,515,713 B1 * 2/2003 Nam

* cited by examiner

Primary Examiner—David E. Harvey

(57) ABSTRACT

A receiver for VSB signals includes tuner channel changing circuitry. AGC circuitry, an IF FPLL and confidence counters, for indicating when signal acquisition or loss occurs. When a loss of signal indication is generated, the IF FPLL is reset, but not the tuner channel changing circuitry and the AGC circuitry, in order to quickly reacquire the signal. If the loss of signal indication persists for a predetermined time or for a predetermined number of loss of signal indications, the IF FPLL, the tuner channel changing circuitry and the AGC circuitry are all reset to reacquire the signal.

12 Claims, 2 Drawing Sheets

VSB RESET TO MINIMIZE DATA LOSS

BACKGROUND OF THE INVENTION

This invention relates generally to VSB (vestigial sideband) ATSC (Advanced Television Systems Committee) television receivers and particularly to a technique for minimizing viewer inconvenience and data loss due to disturbances, such as airplane flutter and noise, that cause temporary signal impairments.

In the prior art VSB receivers, confidence counters indicate the status of segment sync and frame sync recovery and hence the condition of signal acquisition. In the presence of signal disturbances due to spurious noise, airplane flutter, or the like, the confidence counters indicate a loss of signal condition which results in the resetting of the currently tuned channel, the IF FPLL carrier acquisition loop, the confidence counters and the AGC signal. This results in the receiver initiating a new signal acquisition cycle. The reacquisition procedure takes on the order of 0.1 to 0.3 seconds, during which time the viewing for the user (or the received data) is interrupted. This can be very disconcerting to the user, especially where the signal loss is of very short duration such as that which may occur due to airplane flutter, in which the basic signal is being received in the presence of rapidly changing multipath signals. Upon passage of the signal disturbance, the receiver returns to normal operation with the signal properly locked in.

With the invention, in the event of a signal loss indication, the receiver attempts to quickly reacquire the signal without initiating the relatively long reacquisition process. This is accomplished by resetting only the FPLL IF carrier acquisition loop while maintaining channel tuning and the AGC levels in the tuner and IF blocks. Should the disturbance be short-lived, the FPLL controlling the IF carrier acquisition will quickly relock and the data interruption to the user (or viewer) will be of minimal duration. If the loss of signal indication persists for a longer; predetermined time, then the full signal acquisition procedure is initiated with the currently tuned RF channel, the confidence counters and the AGC being reset along with the IF carrier acquisition FPLL. In this way, the relatively long time to retune the RF channel and stabilize the AGC is eliminated.

OBJECTS OF THE INVENTION

A principal object of the invention is to provide an improved VSB television receiver.

Another object of the invention is to provide an enhanced signal reset procedure for a VSB television receiver.

A further object of the invention is to provide a VSB television receiver with enhanced performance under short duration signal loss conditions.

BRIEF DESCRIPTION OF THE DRAWINGS

These and other objects and advantages of the invention will be apparent upon reading the following description in conjunction with the drawings in which.

DETAILED DESCRIPTION OF THE INVENTION

Figure 1:
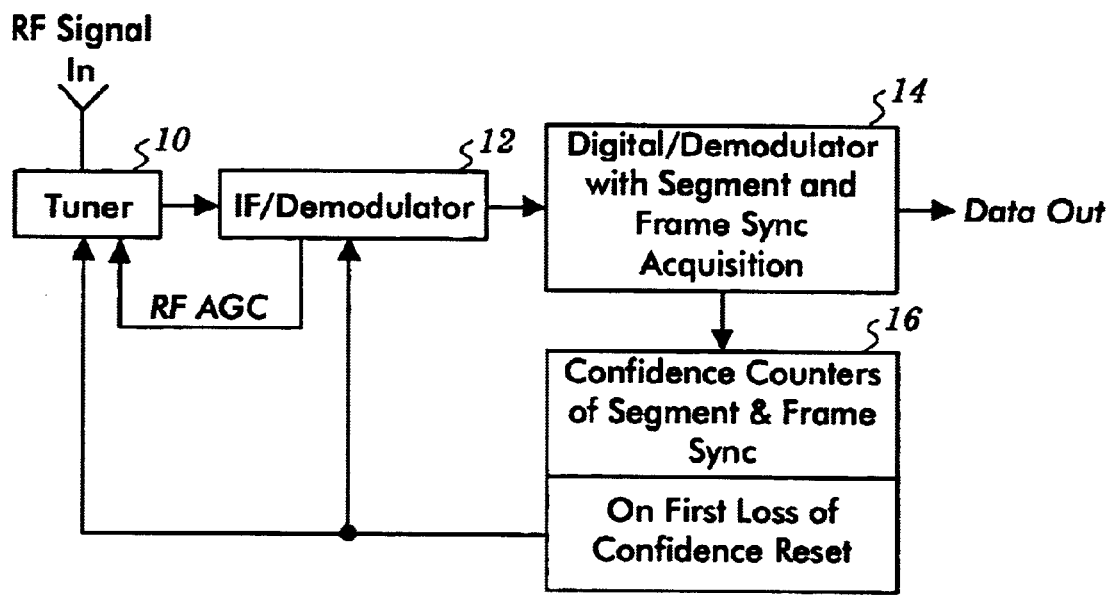
FIG. 1 is a simplified block diagram of a prior art VSB television receiver.

In the prior art VSB receiver of FIG. 1, a tuner 10 receives an RF VSB signal and processes it to produce an IF signal, all in a well-known manner. The IF signal is supplied to an IF demodulator 12 that, in accordance with standard VSB processing practice, includes an FPLL signal acquisition loop that serves to lock the television receiver to the pilot in the received VSB signal. The output of IF demodulator 12 is supplied to a digital demodulator that includes circuitry for finding or acquiring the VSB segment sync and frame sync signals. The IF demodulator 12 also supplies an AGC control for tuner 12. The syncs are supplied to confidence circuitry 16 that includes confidence counters (not shown) that are reset at the beginning of the signal acquisition cycle and count up as repetitive syncs are found in the correct locations. The outputs of the confidence counters, in turn, control the AGC system and the resetting of the appropriate receiver circuitry, as required, in the event of loss of signal. In the prior art system, when the confidence counters indicated a loss of signal, the signal acquisition cycle is initiated with the confidence counters being reset, the RF channel being retuned, the FPLL loop being reset or relocked and the AGC system being placed in its initial state so that the receiver can be adjusted to receive desired VSB signals. As mentioned above, the signal acquisition process is relatively long and during the acquisition process, the viewer or user is deprived of transmitted data and/or a meaningful display on the television screen.

Figure 2:
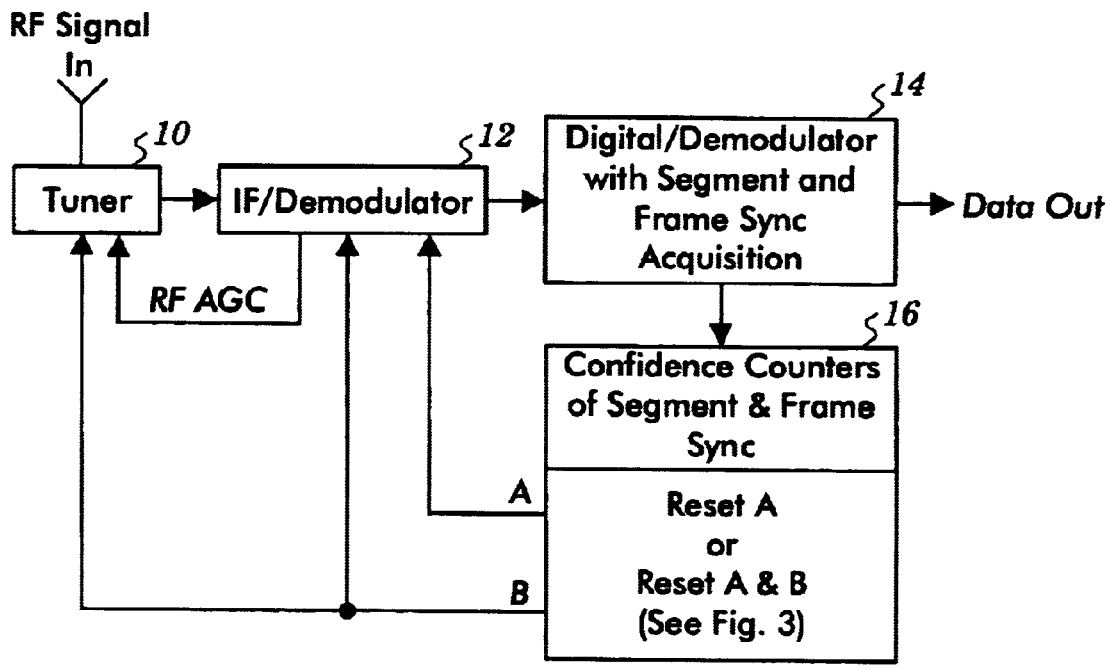
FIG. 2 is a simplified block diagram of a VSB television receiver constructed in accordance with the invention.

In FIG. 2, the invention is illustrated. Most of the hardware is identical to the prior art arrangement of FIG. 1, but operation upon the occurrence of a loss of signal indication from the confidence counters is different. Specifically, the inventive system attempts a "quick" reacquisition of the signal in the event of a loss of signal indication before initiating a full reset and signal reacquisition cycle. The quick reacquisition involves relocking the FPLL loop without resetting either the AGC system or the channel tuning. If only a temporary loss of signal is involved, the receiver tuning parameters will be at the proper values when the signal returns and reacquisition can take place very rapidly, with minimal disruption to the viewer/user. In the lower portion of confidence circuitry 16, two reset lines, A and B are shown. Line B corresponds to the prior art arrangement in FIG. 1, whereas line A represents the resetting of the IF signal acquisition FPLL only, as discussed above. The flow chart of FIG. 3 should be consulted to ascertain the activation of lines A and B.

It will be appreciated that, while the preferred embodiment of the invention initiates a full system reset and signal reacquisition cycle after the second loss of signal indication from the confidence counters, any predetermined number of loss of signal indications may be established, (or, alternatively a predetermined time delay) at the discretion of the system designer.

Figure 3:
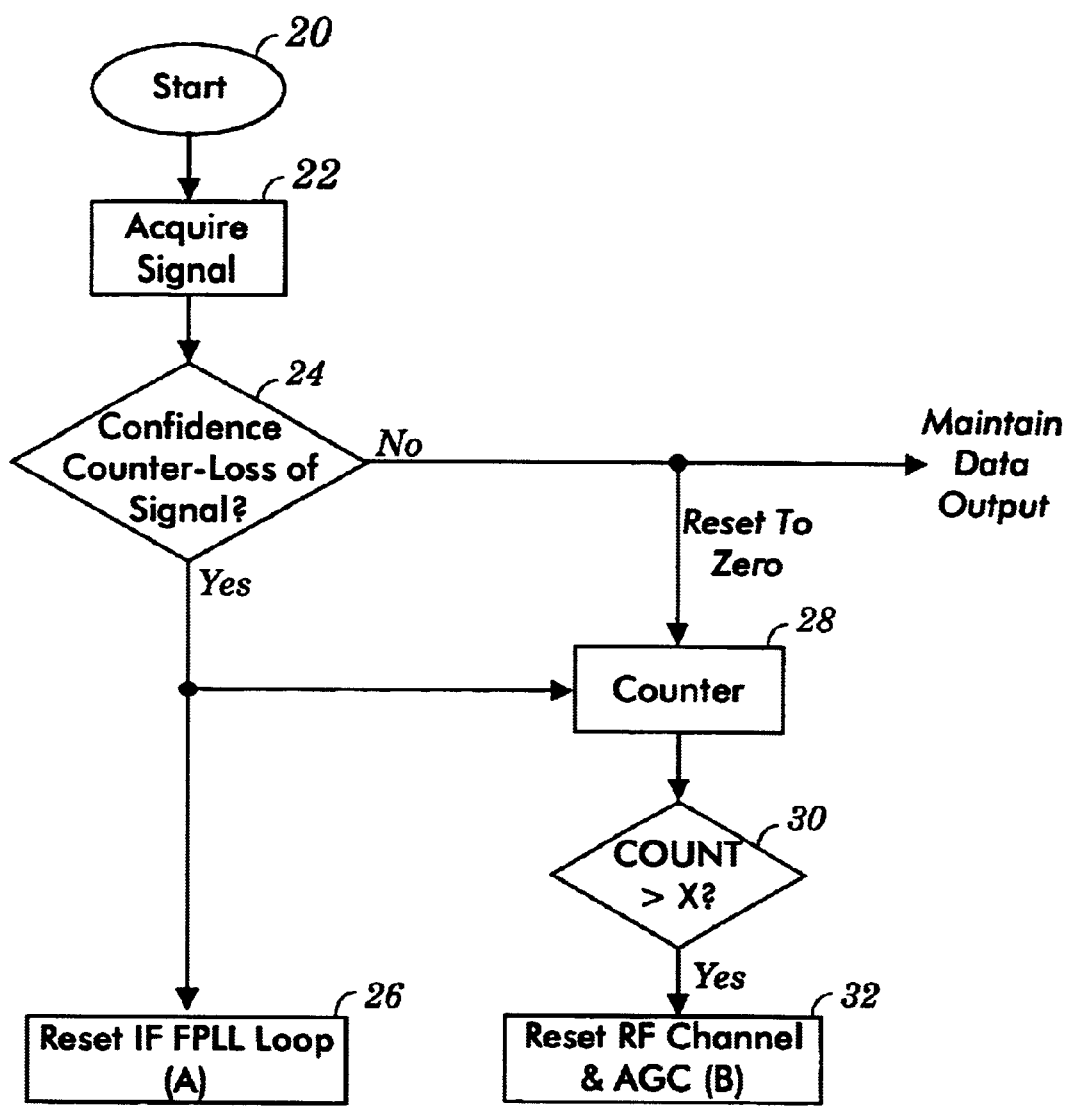
FIG. 3 is a simplified flow chart illustrating operation of the invention.

In FIG. 3, a simplified flow diagram of the inventive method and apparatus is shown. Step 20 is labelled START and represents the initiation of a full signal acquisition cycle. Step 22 indicates signal acquisition, whereas step 24 queries the confidence counters as to the signal status. If no signal loss indication is generated (by the appropriate count of the confidence counters) the system is stable and nothing occurs to change operating conditions. If however, a loss of signal indication is generated, step 26 provides for resetting of the IF FPLL loop in an effort to quickly reacquire the signal. If the signal is reacquired, the system again is stabilized. If reacquisition does not occur, step 28 counts the number of attempts (or the elapsed time in an appropriate design), step 30 determines whether the threshold has been reached. If the threshold has been reached the RF channel tuning and the AGC are reset in step 32 which, in conjunction with the resetting of the IF FPLL loop that occurs in step 26, produces a complete reacquisition cycle. As mentioned, the preferred embodiment is set to initiate a full reacquisition cycle if the quick reset is not successful after a single reset of the IF FPLL loop, but the flow chart (and the invention) is not so limited.

What has been described is a VSB receiver with a novel reset arrangement for enhancing receiver operation in the event of short duration signal loss conditions. It is recognized that numerous changes to the described embodiment of the invention will be apparent to those skilled in the art without departing from its true spirit and scope. The invention is to be limited only as defined in the claims.

What is claimed is:

1. A method of operating a VSB receiver having AGC circuitry, tuner channel changing circuitry signal acquisition means for indicating when a VSB signal has been acquired, and IF FPLL circuitry, comprising:

resetting the IF FPLL circuitry, but not the tuner channel changing circuitry and the AGC circuitry, to attempt signal reacquisition upon an indication from the signal acquisition means that a loss of signal has occurred; and resetting the tuner channel changing circuitry, the AGC circuitry and the IF FPLL circuitry upon a subsequent indication from the signal acquisition means that the loss of signal continues.

2. The method of claim 1, further comprising:

repeating the step of resetting the IF FPLL circuitry, but not the tuner channel changing circuitry and the AGC circuitry, for a predetermined number of indications of signal loss before resetting the tuner channel changing circuitry, the AGC circuitry and the IF FPLL circuitry.

3. The method of claim 2, wherein the receiver includes confidence circuitry for indicating the status of signal acquisition, and further including:

resetting the IF FPLL circuitry when the confidence circuitry indicates a loss of signal.

4. The method of claim 3, wherein the confidence circuitry includes counters for indicating segment sync acquisition and frame sync acquisition, and further including:

resetting the counters whenever the IF FPLL circuitry is reset.

5. A method of operating a VSB receiver having tuner channel changing circuitry, AGC circuitry, signal acquisition means, including confidence circuitry for indicating the status of signal acquisition, and IF FPLL circuitry, comprising:

resetting the IF FPLL circuitry, but not the tuner channel chancing circuitry and the AGC circuitry, to attempt signal reacquisition upon an indication from the signal acquisition means that a loss of signal has occurred;

repeating the step of resetting the IF FPLL circuitry, but not the tuner channel changing circuitry and the AGC circuitry, for a predetermined number of indications of signal loss; and resetting the tuner channel changing circuitry, the AGC circuitry and the IF FPLL circuitry after the predetermined number of indications of signal loss.

6. The method of claim 5, wherein the confidence circuitry includes counters for determining segment sync acquisition and frame sync acquisition, and further including:

resetting the counters whenever the IF FPLL circuitry is reset.

7. A VSB receiver having tuner channel changing circuitry, AGC circuitry, signal acquisition means for determining when a VSB signal has been acquired and IF FPLL circuitry, comprising:

means for indicating a loss of signal;

means for resetting said IF FPLL circuitry, but not said tuner channel changing circuitry and said AGC circuitry, to attempt signal reacquisition; and means, effective upon a subsequent indication that said loss of signal continues, for resetting said tuner channel changing circuitry, said AGC circuitry and said IF FPLL circuitry.

8. The receiver of claim 7, further including means for resetting said IF FPLL circuitry, but not said tuner channel changing circuitry and said AGC circuitry, for a predetermined number of said loss of signal indications before resetting said AGC circuitry.

9. The receiver of claim 8, further including confidence circuitry for indicating the status of signal acquisition;

said IF FPLL circuitry being reset when said confidence circuitry indicates that a loss of signal has occurred.

10. The receiver of claim 9, wherein said confidence circuitry includes counters for determining segment sync acquisition and frame sync acquisition;

said counters being reset whenever the IF FPLL circuitry is reset.

11. A VSB receiver having tuner channel changing circuitry, AGC circuitry, signal acquisition means, including confidence circuitry for indicating the status of signal acquisition, for determining When a VSB signal has been acquired, and IF FPLL circuitry, comprising:

means, responsive to a loss of signal indication from said confidence circuitry signifying that a loss of signal has occurred, for resetting said IF FPLL circuitry, but not said tuner channel changing circuitry and said AGC circuitry, to attempt signal reacquisition; and said resetting means, after a predetermined number of said loss of signal indications from said confidence circuitry, resetting said tuner channel changing circuitry, said AGC circuitry and said IF FPLL circuitry.

12. The receiver of claim 11, wherein said confidence circuitry includes counters for determining segment sync acquisition and frame sync acquisition, and further including:

said counters being reset whenever said IF FPLL circuitry is reset.

* * * * *